(12) United States Patent  
Nishioka

(10) Patent No.: US 7,863,930 B2  
(45) Date of Patent: Jan. 4, 2011

(54) PROGRAMMABLE DEVICE, CONTROL METHOD OF DEVICE AND INFORMATION PROCESSING SYSTEM

(75) Inventor: Shinichiro Nishioka, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/598,099

(22) PCT Filed: Sep. 18, 2008

(86) PCT No.: PCT/JP2008/002567

§ 371 (c)(1),  
(2), (4) Date: Nov. 5, 2009

(87) PCT Pub. No.: WO2009/063584

PCT Pub. Date: May 22, 2009

(65) Prior Publication Data

US 2010/0148820 A1      Jun. 17, 2010

(30) Foreign Application Priority Data

Nov. 13, 2007    (JP)    .............................. 2007-293926

(51) Int. Cl.  
*G06F 7/38* (2006.01)  
*H03K 19/177* (2006.01)  
*H01L 25/00* (2006.01)

(52) U.S. Cl. ............................. 326/39; 326/38; 326/41; 326/47; 326/101

(58) Field of Classification Search ............. 326/37–41, 326/47, 101  
See application file for complete search history.

(56) References Cited

U.S. PATENT DOCUMENTS

| 5,696,455 | A | * | 12/1997 | Madurawe | .................... | 326/41 |
| 5,778,439 | A | * | 7/1998 | Trimberger et al. | ......... | 711/153 |
| 6,172,521 | B1 | | 1/2001 | Motomura | | |
| 6,256,252 | B1 | * | 7/2001 | Arimoto | ..................... | 365/227 |
| 7,098,689 | B1 | * | 8/2006 | Tuan et al. | .................. | 405/100 |
| 7,620,926 | B1 | * | 11/2009 | Tuan | ........................... | 716/16 |
| 2006/0202714 | A1 | * | 9/2006 | Hoang et al. | .................. | 326/38 |
| 2009/0072857 | A1 | * | 3/2009 | Perisetty | ...................... | 326/38 |

FOREIGN PATENT DOCUMENTS

| JP | 2001-284530 | 1/2001 |
| JP | 2001-93275 | 4/2001 |
| JP | 2005-5611 | 1/2005 |

OTHER PUBLICATIONS

International Search Report issued Nov. 25, 2008 in International (PCT) Application No. PCT/JP2008/002567.

* cited by examiner

*Primary Examiner*—Rexford N Barnie  
*Assistant Examiner*—Thienvu V Tran  
(74) *Attorney, Agent, or Firm*—Wenderoth, Lind & Ponack, L.L.P.

(57) ABSTRACT

A programmable device operates at high speed while reducing power consumption. The programmable device includes a plurality of processing tiles each including a configuration memory and a core logic unit, a configuration control unit for programming them, and a power control unit for cutting off a power supply depending on an operating state. The power supply of the core logic unit is cut off after saving the internal state of the core logic unit in the configuration memory, and power is supplied again to the core logic unit before the internal state is restored from the configuration memory to the core logic unit, thus saving power while maintaining the internal state.

6 Claims, 14 Drawing Sheets

Header switch

Footer switch

Exemplary state machine

Exemplary function allocation

Exemplary wait status signal generation

PROGRAMMABLE DEVICE, CONTROL METHOD OF DEVICE AND INFORMATION PROCESSING SYSTEM

BACKGROUND OF THE INVENTION

1. Technical Field

The present invention relates to power saving in a programmable device.

2. Background Art

In recent years, a dynamic reconfigurable device has been developed that can change a configuration in a short time such as from several microseconds to several nanoseconds, even when operating (see non-patent document 1).

When the device is made to be more high-speed and miniaturized, there is a problem of leaked power, which takes up as much as approximately 50% of the total consumed energy of a chip.

As a measure against this problem, a technology is disclosed in patent document 1, in which power gating technology is applied and power supply is cut off to any circuit block that is not assigned a function and is unused, or is in a wait state.

Patent document 1: U.S. Pat. No. 7,098,689

Non-patent document 1: Masato Motomura, "*A Dynamically Reconfigurable Processor Architecture*", *Microprocessor Forum*, October 2002

However, in the above-described technology, there is the following issue. When a power supply to a circuit block in a wait state, for which operation has been temporarily stopped, is cut off to conserve energy, operations of the circuit block, including configuration information that defines the operations of the circuit block, are lost from an SRAM (Static Random Access Memory) and it is necessary to set the configuration information again the next time that power is supplied. Therefore, restarting operation from a pre-standby state cannot be performed immediately.

In view of the above issue, an object of the present invention is to provide a programmable device capable of saving power by performing high-speed power supply cut off control in which the internal state is not lost when the power supply is cut off.

In order to solve the above problem, the present invention is a programmable device including one or more processing tiles including a core logic unit that performs a calculation indicated by circuit information, and a configuration memory that stores the circuit information to be set in the core logic unit; a power supply unit operable to supply power to the core logic units and the configuration memories; and a control unit operable to, for each of the one or more processing tiles, when the processing tile is unused, cut off a power supply route to the core logic unit that is separate from a power supply route to the configuration memory.

SUMMARY OF THE INVENTION

By including the above-described structure, the programmable device of the present invention can cutoff and restore power to core logic units not being used, without losing internal states of such core logic units, thereby enabling saving power by effectively reducing power consumed by unnecessary current leaks that occur due to constantly supplying power to the core logic unit.

Here, since the consumed power of the core logic unit is normally higher than the consumed power of a configuration memory unit by two digits, cutting off the power supply to the core logic unit alone reduces the consumed energy to approximately less than or equal to 1%.

Also, upon temporarily cutting off the power supply to both the core logic unit and the configuration memory, when again power is supplied and both are caused to operate, there is a need to sequentially read initial settings, etc. from an external storage device or the like to the configuration memory, and the reading takes time. By supplying power to the configuration memory as in the present invention, since it is not necessary to take time for reading initial settings, etc. from an external storage device or the like to the configuration memory as described above, it is possible to rapidly cut off and restore power, and reduce the time needed for processing for the device as a whole.

Also, the control unit, when cutting off the power supply route to the core logic unit, may be configured not to cut off the power supply route to the configuration memory.

According to this structure, since the power supply to the core logic unit, which has greater consumed energy than the configuration memory, can be stopped independently from the configuration memory while providing power to the configuration memory, power consumption can be reduced.

Also, the control unit, when operation of a processing tile that has been assigned a function is temporarily stopped, may cut off the power supply route to the core logic unit included in the processing tile, and may be configured not to cut off the power supply route to the configuration memory included in the processing tile.

According to this structure, it is possible to reduce power consumed by a core logic unit that has been assigned a function but is not in operation, and since the content of the configuration memory can be maintained even when cutting off the power supply to the core logic unit, the time required for restarting operation can be shortened.

Also, the control unit, when a processing tile is not assigned a function, may cut off the power supply routes to each of the configuration memory and the core logic unit, respectively, in the processing tile.

Also, the control unit, when a processing tile is assigned a function, may set the circuit information in the core logic unit.

According to this structure, by cutting off a power supply to the configuration memory if the configuration memory does not have a function assigned, or is in a wait state, while cutting off the power supply to a core logic unit that is not in operation, power supply cut off can be applied for an effective period and range.

Also, the control unit, when the power supply route to the core logic unit is to be cut off, before cutting off the power supply route, may cause the internal state of the core logic unit to be saved in the configuration memory, and when the power supply route is to be connected, after connecting the power supply route, may cause the internal state to be restored to the core logic unit.

According to this structure, an internal state in a core logic unit that is volatile when the power supply is cut off can be saved/restored in each processing tile in parallel simultaneously, without using an external storage device, thus enabling improving the speed of power supply cut off control.

Also, the control unit, when causing the internal state of the core logic unit to be saved, may cause the internal state to be saved in an area that stores an initial setting of the core logic unit in the configuration memory.

Also, the control unit, when causing a previously saved internal state to be restored to the core logic unit, may read the internal state from the area that stores the initial setting, and set the read internal state in the core logic unit.

According to this structure, saving the internal state of the core logic unit in a preexisting area in the configuration memory enables controlling increasing area cost since there is no need to expand areas in the configuration memory.

Also, the control unit, when causing the internal state of the core logic unit to be saved, may cause the internal state to be saved in a different area from an area that stores an initial setting of the core logic unit in the configuration memory.

According to this structure, when the internal state cannot be saved in the same area in the configuration memory that stores configuration information of a changed configuration, the internal state of before changing the configuration can be saved by giving a new expanded area to the configuration memory.

Also, the configuration memory may include a transistor whose threshold voltage is higher than a threshold voltage of a transistor in the core logic unit.

Also, the configuration memory may include a transistor whose gate insulator film has a greater insulating property than a gate insulating film of the core logic unit.

According to this structure, rather than the core logic for which extremely high speed operation is generally required, the configuration memory which is basically in a static state after the configuration change can be made low-leakage, and leaked power as a whole can be reduced, since the power is cut off to the core logic only.

The device control method of the present invention is for controlling a programmable device including one or more processing tiles including a core logic unit that performs a calculation indicated by circuit information, and a configuration memory that stores the circuit information to be set in the core logic unit, the device control method including the steps of supplying power to the core logic units and the configuration memories, and performing control to, for each of the one or more processing tiles, when the processing tile is unused, cut off a power supply route to the core logic unit that is separate from a power supply route to the configuration memory.

The information processing system of the present invention includes a programmable device; an external storage unit operable to store therein circuit information to deliver to the programmable device; and an external power supply unit operable to drive the programmable device, wherein the programmable device includes one or more processing tiles including a core logic unit that performs a calculation indicated by circuit information, and a configuration memory that stores the circuit information to be set in the core logic unit, a power supply unit operable to supply power supplied from the external power supply unit to the core logic units and the configuration memories, and a control unit operable to, for each of the one or more processing tiles, when the processing tile is unused, out off a power supply route to the core logic unit that is separate from a power supply route to the configuration memory.

By including the above-described structure, the programmable device of the present invention can cut off and restore power to core logic units not being used, without losing internal states of such core logic units, thereby enabling saving power by effectively reducing power consumed by unnecessary current leaks that occur due to constantly supplying power to the core logic unit.

Figure 1:
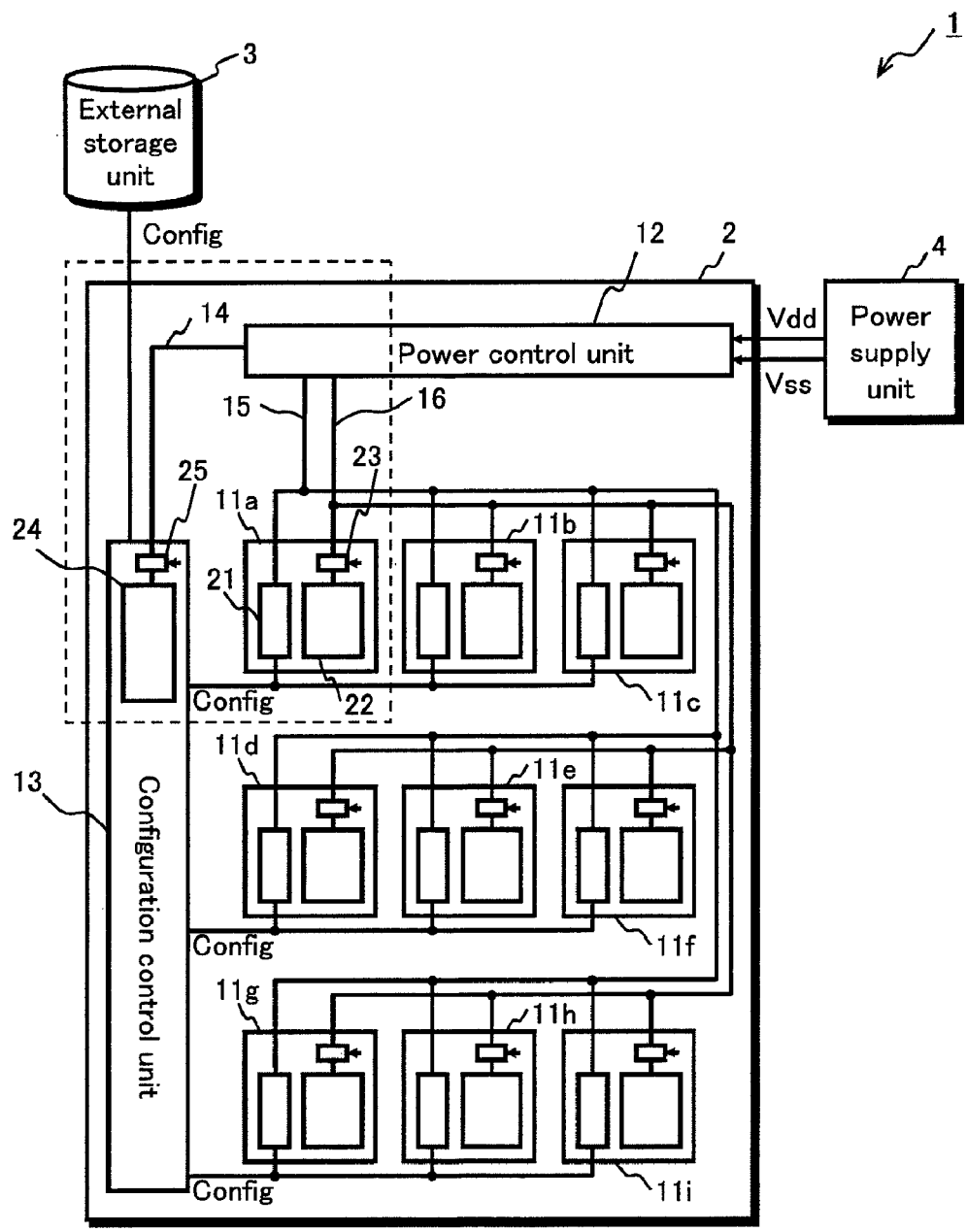
FIG. 1 is a block diagram showing a structure of a programmable device pertaining to embodiment 1.

DESCRIPTION OF THE CHARACTERS 2 programmable device
11 processing tiles
12 power control unit
14-16 power supply lines
21 configuration memory
22 core logic
23, 25 power gating switch
32 memory cell
41 processing logic
51 shift register
52 configuration sequencer
100 programmable device
101 logic block
103 logic cell
105 configuration memory
106 core logic
121 switch elements
122 memory cell
301 power gating switch
501 configuration memory
503 power control unit
507 core logic

DETAILED DESCRIPTION OF THE INVENTION

The following describes the programmable device of embodiment 1 of the present invention with reference to the drawings.

1. Embodiment 1

1.1 Structure

FIG. 1 shows a block diagram of a processing system 1 pertaining to the present embodiment.

The processing system 1 includes a programmable device 2, an external storage unit 3 for storing configuration information (Config) of circuits in the programmable device 2, and a power supply unit 4.

The programmable device 2 includes a plurality of processing tiles 11 (11a, 11b ... 11i) each of which is a programmable logical processing unit, a configuration control unit 13 that delivers the configuration information to the processing tiles 11 and performs programming, a power control unit 12 that controls power output by the power supply unit 4, and power supply lines 14 to 16.

Also, each of the processing tiles 11a to 11i include a configuration memory 21 that stores the configuration information, a core logic 22 that performs calculation processing according to content stored in the configuration memory 21, and a power gating switch 23 for performing on/off control of the power supply to the core logic 22.

The configuration control unit 13 includes a power gating switch 25 and a data control unit 24 that controls inputting data to, and outputting data from, the processing tiles 11.

The programmable device 2 improves energy conservation by cutting off a power supply to a core logic 22 that is not assigned a function or is not active. In the power supply control, after an internal state of the core logic 22 is saved in the memory 11, the power supply to the core logic 22 is cut off. Power is supplied again to the core logic 22, and the internal state is restored to the core logic from the configuration memory 11. This enables maintaining and not losing the internal state of the core logic 22, and saving power.

The following describes details of the structure.

1.1.1. Programmable Device 2

As described above, the programmable device 2 includes a plurality of processing tiles 11 (11a, 11b ... 11i), a configuration control unit 13, a power control unit 12, and power supply lines 14 to 16.

Here, since the structure of the processing tiles 11b to 11i are the same as the structure of the processing tile 11a, the following mainly describes the portion enclosed by a dotted line in FIG. 1, that is to say, the processing tile 11a, the configuration control unit 13, the power control unit 12, and the power supply lines 14 to 16 as structures of the programmable device 2.

Figure 2:
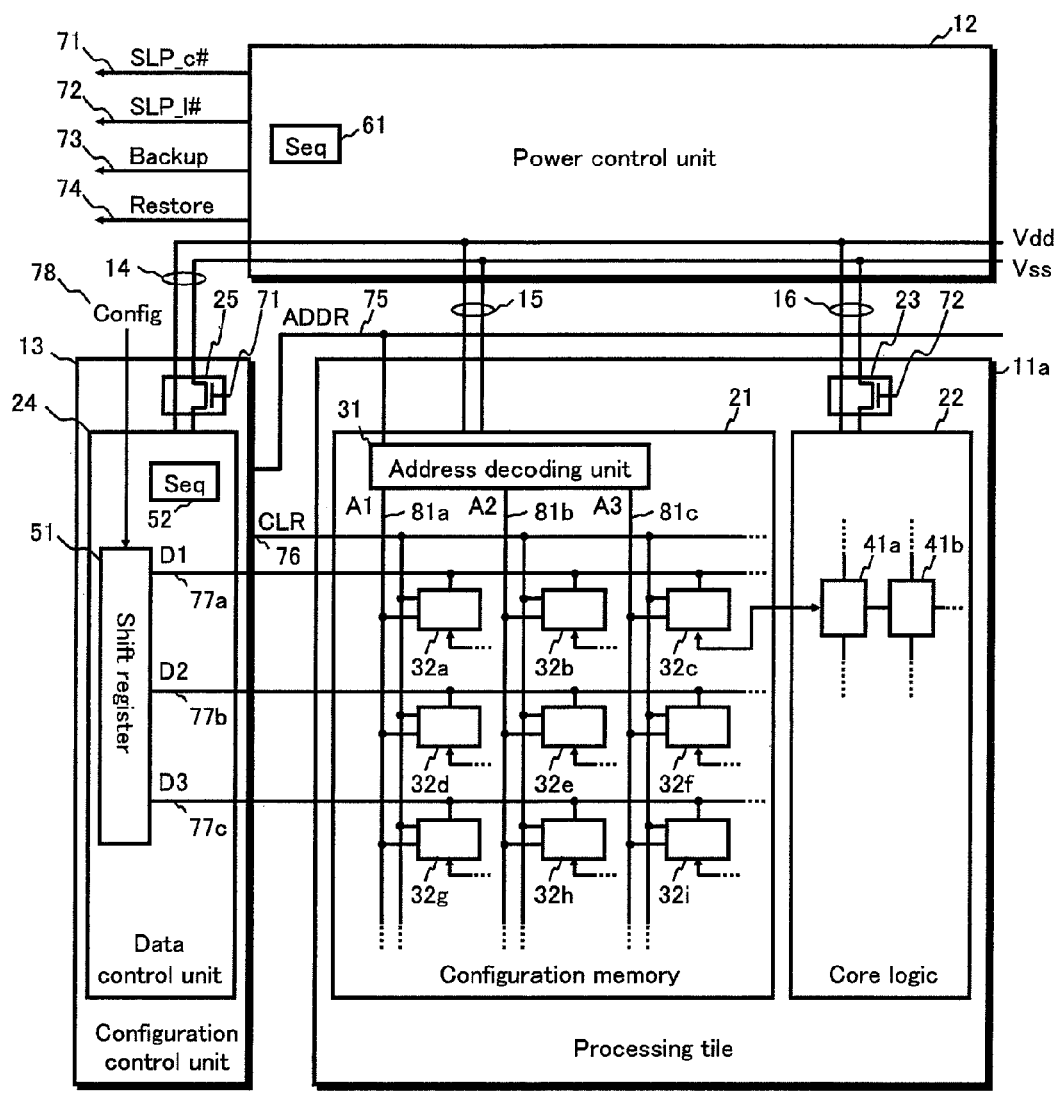
FIG. 2 is a block diagram illustrating details of the programmable device pertaining to embodiment 1.

The details of the portion enclosed by the dotted line in FIG. 1 are shown in FIG. 2.

1.1.1.1. Processing Tiles 11

The processing tile 11a includes the configuration memory 21 that stores configuration information (Config) acquired from the configuration control unit 13, the core logic 22 that realizes calculation and logical calculation functions depending on the content of the memory 21 and a function of internal and external mutual connection, and a power gating switch 72 that controls whether to supply power to the core logic 22.

(1) Core logic 22

The core logic 22 includes a plurality of processing logics 41 (41a, 41b ... ).

Figure 3:
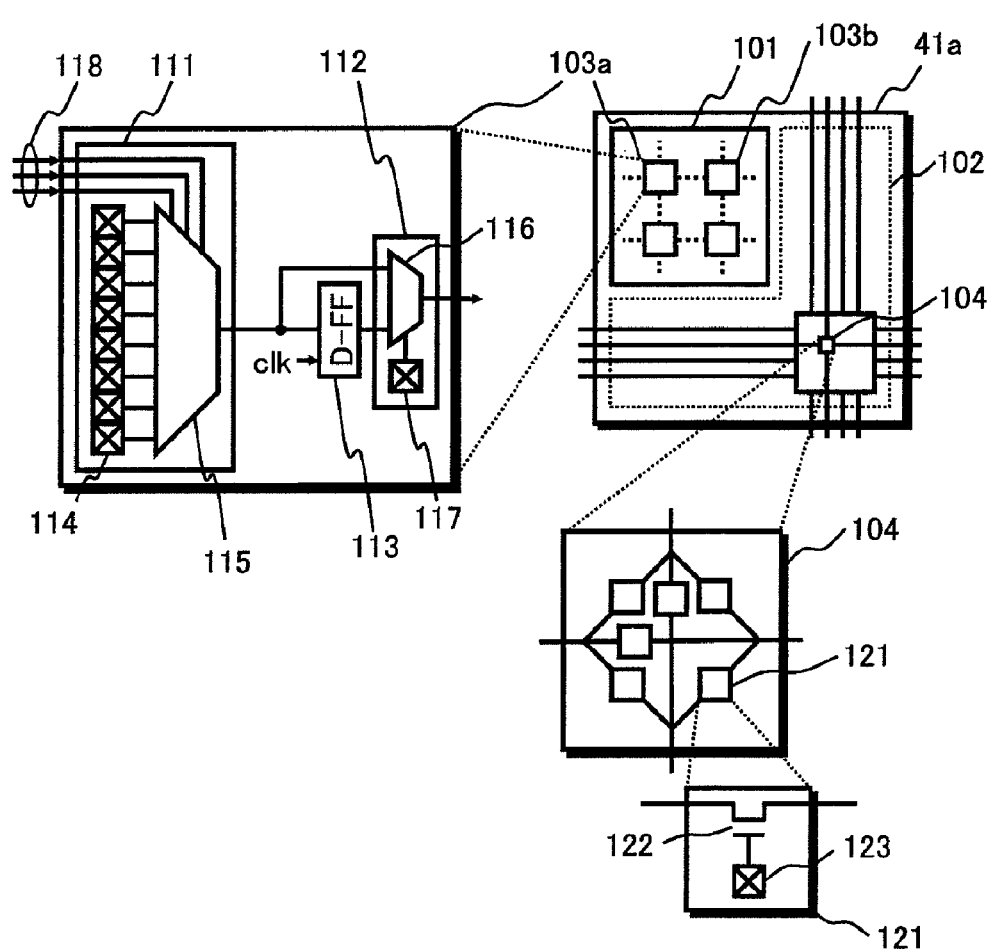
FIG. 3 shows a structure of a processing unit pertaining to embodiment 1.

FIG. 3 shows a structure of the processing logic 41a.

Note that since the structure of the processing logics 41b ... is the same as the structure of the processing logic 41a, description thereof is omitted here.

The processing logic 41a includes a logic block 101 that performs computation/logical calculation, and an interconnect 102 that performs input and output of data between the other processing tiles and logic blocks.

A plurality of logic cells 103 (logic cells 103a, 103b ... ) that have computation/logical calculation functions are integrated in the logic block 101.

The logic cells 103 include an LUT (Look Up Table) 111 that is a basic calculation element, a D-flip flop (D-FF) 133 that stores calculation result data of the LUT 111, and a multiplexer 117 that selects output.

The LUT 111 is a basic calculation element that outputs one bit of calculation results for n bits of input, and includes a memory cell 114 and a selector 115.

The memory cell 114 is a memory that stores $2^n$ bits of configuration information, and is constituted from, for example, an $2^n$-bit SRAM (Static Random Access Memory).

The selector 115 selects, from the $2^n$ bits of data stored in the memory cell 114, 1 bit of data corresponding to n bits of input values (118), and outputs the selected 1 bit of data.

The D-FF 113 is a register for storing an internal state such as a calculation result of the LUT 114.

The multiplexer 112 is constituted from a 2-in, 1-out selector 116 and a memory cell 117.

The selector 116 outputs one of the two inputs according to the data recorded in the memory cell 117.

The interconnect 102 includes a wiring element that transmits data, and a switch box 104 that switches connections for each wiring element.

The wiring element is connected to a wiring element in another processing unit.

The switch box 104 includes six switch elements 121, an example of which is shown in FIG. 3.

The switch elements 121 include a path transistor 122 and a memory cell 123. When the data stored in the memory cell 123 is 1, the path transistor 122 turns on, and when the data is 0, the path transistor 122 turns off.

That is to say, changing data stored in the memory cell 123 enables freely changing between connecting to other processing tiles positioned to the up, down, left and right.

As described above, the processing logics 41a, 41b ... respectively require a plurality of respective $2^n$ bit memory cells 210, and 1-bit memory cells 211, and also require 6 sets of 1-bit memory cells 212.

As described above, a plurality of memory cells are integrated in the core logic 22 that includes the plurality of processing logics 41.

(2) Configuration Memory 21

The configuration memory 21 decodes an array constituted from a plurality of memory cells 32 (32a, 32b ... 32i), and a global Address (ADDR) that specifies one memory cell 32, and includes an address decoding unit 31 that outputs addresses A1 to A3 that specifies the one of the memory cells 32.

The address decoding unit 31 decodes the global address (ADDR) input from the configuration control unit 13, specifies the one of the memory cells 32 (one of memory cells 32a, 32b ... 32i) that is specified by the ADDR, and outputs an address (A1, A2, or A3) to select the row that the specified memory cell 32 belongs to.

Here, although the example shown in FIG. 2 of the memory cell 32 is a 3×3, 2-dimensional array structure, actually, an array of several hundred to several thousand memory cells is necessary for programming the core logic.

The memory cell 32 is a memory that stores data (D1, D2, and D3) output from the configuration control unit 13.

The address decoding unit 31 outputs an address that specifies a column in which the specified memory cell belongs, among the memory cells 32a ... 32i. When data is output for the column in which the specified memory cell belongs, the memory cell receives and stores the data.

For example, when an address line 515 is driven by the address decoding unit 31 to specify an address A3, and data D3 is output from the configuration control unit 13 to a data line 77c, the data D3 is written to a memory cell 32i.

In the memory cell 32, the storage content is reset when a clear signal (CLR) is input via a signal line 76 by the configuration control unit 13.

The power gating switch 23 connects/disconnects the power supply line 16 of the core logic 22 according to an on/off state of the switch, acid switches the power supply to the core logic 22 between on and off.

Switching on and off is performed according to a signal SLP_I# that is output by the power control unit 12.

Figure 4A:
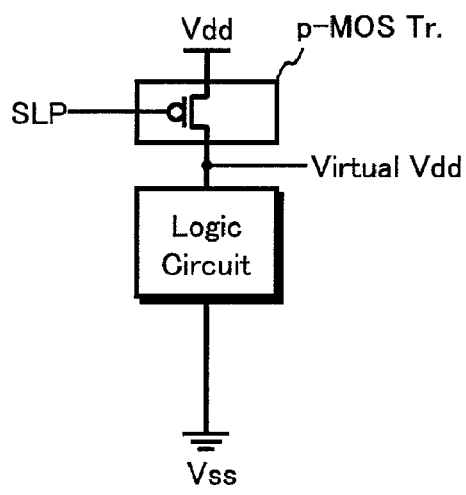
FIG. 4 shows an example of a power gating switch pertaining to embodiment 1.
Figure 4B:
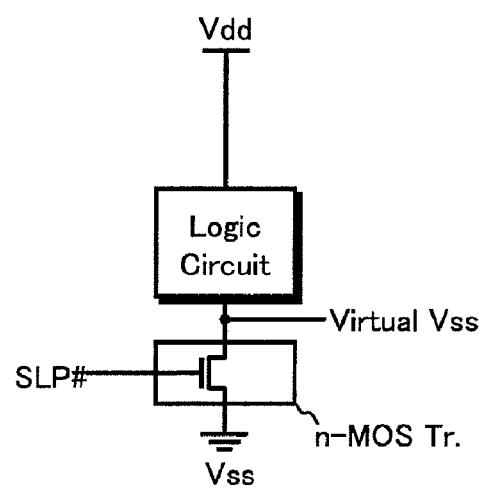

There are times when, as shown in FIG. 4, the power gating switch 23 has, as a header switch, a p-MOS transistor inserted on a power voltage Vdd side of a logic circuit targeted for a power cut off, and also cases in which an n-MOS transistor is grounded, as a footer switch, on a Vss side.

Other structures are possible, such as inserting the MOS transistors in both switches as in the conventional technology (patent document 1). However, footer switches are often used since generally the resistance of the n-MOS transistor in footer switches is slight. A sleep signal SLP (or SLP# for negative true logic) for controlling a power gating switch is generated in the power control unit 12, according to an operation state of the configuration control switch 13 and the processing tiles 11.

Also, in the present embodiment, although a structure in which the power gating switches are included inside the processing tile 11a is described as an example, the present invention is not limited to this. For example, the power gating switches may be included in the power control unit 12, and in this case, the invention may be configured so that when a switch is inserted in a power supply line to a plurality of processing tiles 11a, the power supply to all of the processing tiles 11a is out off at once.

Here, in general, since the core logic 22 is required to calculate large amounts of data instantaneously, there are many cases of configuring the core logic 22 as a high-speed, low threshold voltage transistor, and the leaked current is commensurately large. Meanwhile, since the configuration memory 21 basically enters a static state when loading the configuration information is finished, the programmable device may be configured as a low-speed transistor in which the amount of leaked current is less than or equal to 1% compared to the core logic 22.

The configuration memory 21 in the present invention enables increasing the effectiveness of the invention, due to using a transistor in which the threshold value is high, further achieving low-leakage by using high-k materials, which have high electric permittivity and a thick film, for gate insulating film, thereby making the leakage substantially zero by cutting off the power supply of the internal state of the core logic 22 for which leakage is great, and the internal state can be stored in the low-leakage configuration memory 21.

1.1.1.2. Configuration Control Unit 13

The configuration control unit 13 includes a configuration sequencer 52 that controls the initialization of the configuration memory 21 included in the processing tile 11a and the setting procedure of the configuration information, and a shift register 51 that stores configuration information (Config) input from the external storage unit 3 while sequentially shifting the configuration information.

(1) Configuration Sequencer 52

When writing data in the array of the memory cell 32, by specifying the column by selecting one of address lines 81a to 81c that output the address, and specifying the row by selecting one of the data lines 77a to 77c that output data, the configuration sequencer 52 specifies the row and column of the memory cell 32 to which to write the data, and writes the data to the specified memory cell.

Also, when initializing the configuration memory 21, the configuration sequencer 52 outputs a clear signal CLR via the signal line 76.

The signal line 76 is connected to all portions of the memory array in the same column of the array as the memory cell 32. Clearing is performed in column units, but as in the example described above of writing data to the memory cell 32, the memory array may be configured so that an individual memory cell is specified and a clear signal is sent.

Specifically, when power supply starts, the configuration sequencer 52 performs initialization by asserting the clear signal CLR of the configuration memory, and for the configuration memory 21 in all processing tiles 11, the configuration sequencer 52 sets the configuration information (Config) 78 in column levels of the memory cell 32 while sequentially changing the global addresses ADDR as described above.

(2) Shift Register 51

Also, the shift register 51 serially receives the configuration information 78.

The input configuration information, for each row to which the memory cell 513, to which the data is to be written, belongs, is output as output data (D1, D2, D3) 518.

Also, an address decoding unit 516 need not be provided separately for each configuration memory 501 of the processing tiles 500. Instead, the address line (A1, A2, A3) 515 that outputs the data may be connected to a plurality of memory cells in the processing tiles in the column direction, and processing may be performed on all of these together as a column unit, and the address decoding unit 516 may be configured to have one address decoding unit 516 per row of processing tiles.

(3) Power Gating Switch 25

The power gating switch 25 connects/disconnects the power supply line 14 of the data control unit 24 by switching on/off, and switches the power supply to the core logic on/off.

Here, although an example is given of a structure in which the power gating switch 25 is provided inside the configuration control unit 13, the power gating switch 25 may instead be provided outside the configuration control unit 13. For example, the configuration control unit 13 may be provided in the power control unit 12, or a switch may be inserted in another power supply line.

As shown in FIG. 4, there are cases in which, in the power gating switch 25, as the header switch, a p-MOS-transistor is inserted on the power supply voltage side Vdd of the logic circuit targeted for power cut off, and as the footer switch, an n-MOS transistor is inserted on the grounded Vss side. Similarly to the conventional technology (patent document 1), other structures are possible, such as inserting switches in both sides, but since generally the resistance of the n-MOS transistor is slight, a footer switch is often used.

The sleep signal SLP (or SLP# for negative true logic) for controlling these power gating switches is generated in the power control unit 12 according to an operation state of the configuration control unit 13.

1.1.1.3 Power Control Unit 12

The power control unit 12 supplies power supply voltages Vdd and Vss output by the power supply unit 4 to the configuration control unit 13, and to the configuration memory 21 and the core logic 22 which are in the processing tile 11, via the power supply lines 14 to 16.

Note that the power supply voltages Vdd that supply power to the configuration control unit 13, the configuration memory 21 and the core logic 22 are not required to be identical, and different voltages may be supplied to each, with use of a switching regulator, etc. implemented in the power control unit 12 or the power supply unit 4.

The power control unit 12 includes a power sequencer 61.

The power sequencer 61 monitors the operation state of the core logic 22 in the configuration control unit 13 and the processing tile 11, and controls the power supply procedure by generating sleep control signals (SLP_c#, SLP_I#) 71 and 72, which respectively control the power gating switches 23 and 25.

Since the internal state of the core logic 22 (that is to say, register values, etc. of the processing logic 41) is volatile when the power supply is cut off, before the power supply is cut off, the power sequencer 61 outputs, to a processing tile 11a, a state save signal (Backup) 73 for causing the internal state to be written in the memory cell 32 corresponding to the register values, and a state restore signal (Restore) 74 for resetting a value in the register from the memory cell 32 when recovering from a power cut off.

In this way, the internal state of the core logic 22 before and after the power supply cut off is not lost, and operation can be restarted, when the power supply is restored, at the internal state from before the cut off.

1.2. Operation

Figure 5:
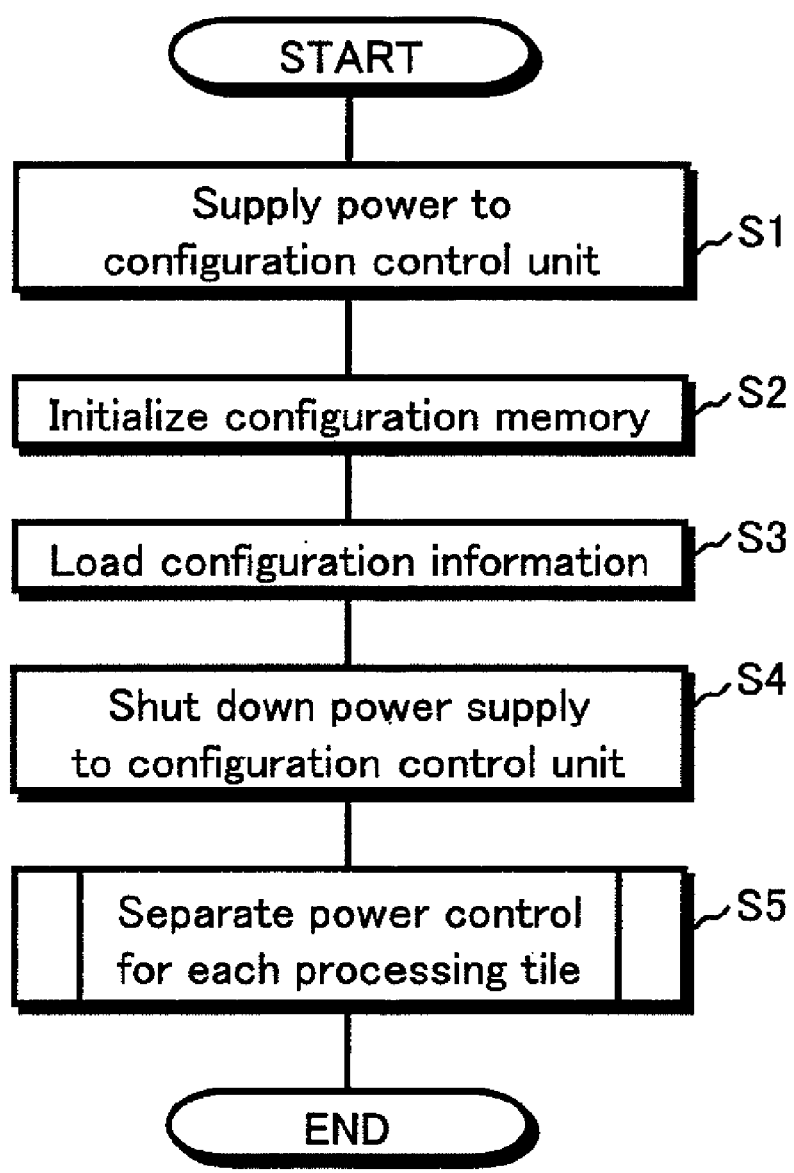
FIG. 5 is a flowchart showing entire control of the programmable device pertaining to embodiment 1.

FIG. 5 is a flowchart showing entire control of the programmable device 1.

First, a user boots the processing system 1.

At this time, the power control unit 12 negates the sleep control signal SLP_c# (here, changing from "0" to "1" for negative logic), turns the power gating switch 25 to the on state, and starts supplying power to the configuration control unit 13 (step S1).

The configuration sequencer 52 in the configuration control unit 13 asserts the clear signal CLR of the configuration memory to which the power supply has been started, and initializes the configuration memory (step S2).

For the configuration memories 21 in all the processing tiles 11, the configuration information (Config) of the memory cell 32 is set, in column units, while sequentially changing the global addresses ADDR as described above (step S3).

When step S3 is finished, the power control unit 12 asserts (changes from "1" to "0") the sleep control signal (SLP_c#) that cuts off the power supply to the configuration control unit 13, and turns the power gating switch 25 off (step S4).

Hereinafter, the power control unit 12 monitors the operation state of each processing tile 11 until all the processing assigned to the processing tiles 11 is finished. For the processing tiles 11 for which operation has finished, control is performed to cut off the power supply to the core logic 22 (step S5).

Figure 6:
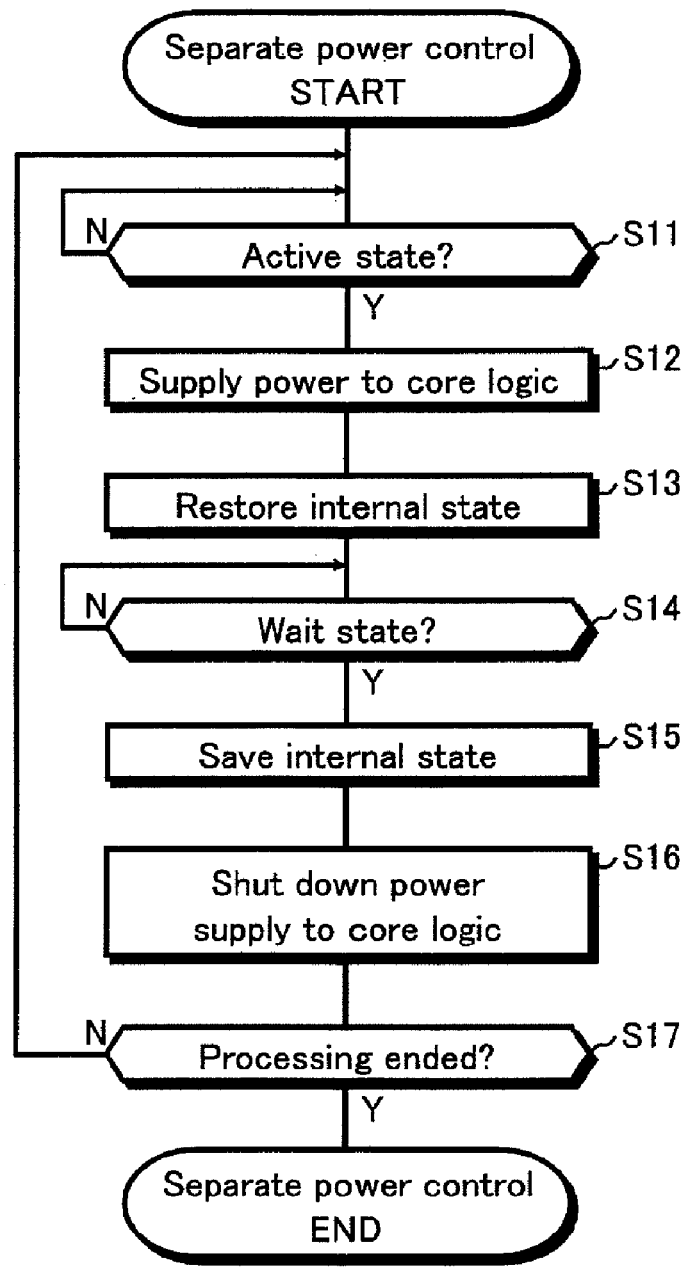
FIG. 6 is a flowchart showing separate power control for each processing tile according to embodiment 1.

FIG. 6 is a flowchart showing details of separate power control for step S5, that is, for each processing tile 500.

The power control unit 12 confirms a wait state signal that indicates whether a targeted processing tile 11 indicates a wait state (inactive state) or an active state, and if the wait state signal indicates an active state, starts the processing (step S11).

The wait state signal is generated by, for example, a logic circuit designed by a user (user circuit).

Supplementary remarks on the user circuit are provided below, with reference to FIG. 7.

Figure 7A:
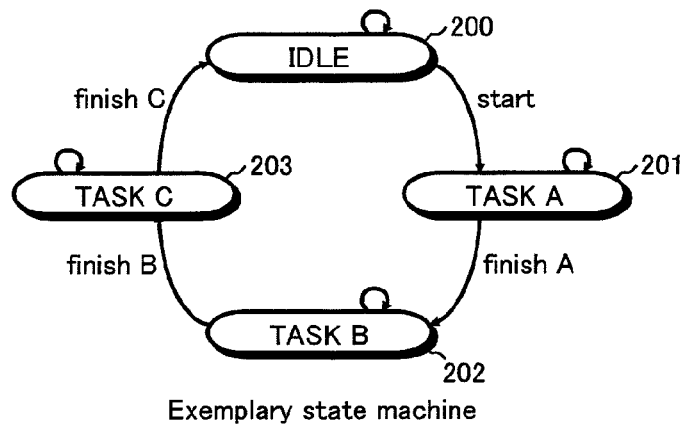
FIG. 7A shows an example of a state machine of a user circuit assigned to the processing tile according to embodiment 1.

For example, as shown in FIG. 7A, after sequentially executing task A (201), task B (202), and task C (203) after a restart from an idle state (200), there are cases of assigning, and causing to be executed, a user circuit controlled by a state machine that transitions to the idle state (200) again, on the programmable device 204.

Figure 7B:
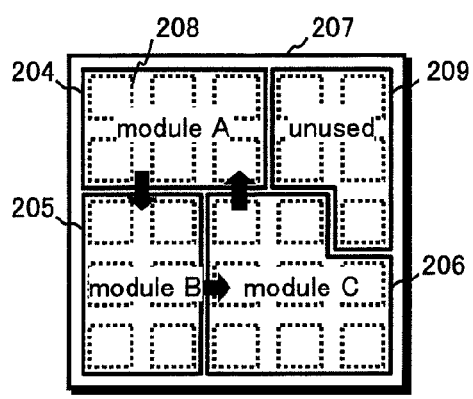
FIG. 7B shows exemplary functional module allocation of a user circuit.
Figure 7C:
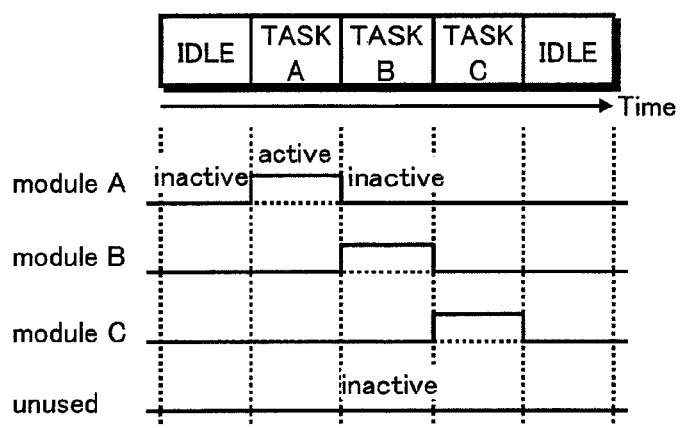
FIG. 7C shows exemplary wait state signals for each functional module.

In such a case, when assigning the circuit modules A (205), B (206), and C (207) that execute tasks A, B, and C respectively to a plurality of processing tiles 208 in the programmable device 204 (FIG. 7(b)), signals are generated so that an active status for the wait state signals of the modules A (205), B (206), and C (207) is indicated only when a task assigned to that module is being executed, and a wait state is displayed at other times (FIG. 7(c)).

Also, the signals are generated so that a standby status signal in the processing tile of an unused area 209 to which a function has not been assigned always indicates the wait state.

Note that the wait state signal is not only explicitly designed by the user circuit, but in some cases also detects the type of state information described above, from the design data (RTL: Register Transfer Level) via an EDA (Electronic Design Automation) tool, and automatically generates the state information.

In the plurality of processing tiles in the same module, the wait state signals are in common, and the power control unit 12 is capable of monitoring the operation state of the processing tiles with use of the wait state signals.

This completes the description of the user circuit, and the following description returns to the flowchart.

Upon detecting that the processing tile 11 is in an active state, the power control unit 12 negates (changes from "0" to "1") the sleep control signal (SLP_I#), turns the power gating switch 23 on, and causes starting power to be supplied to the core logic 22 (step S12).

Next, the content of the internal state register in the processing logic 41 in the core logic 22 is loaded from the memory cell 32 corresponding to the internal state register (step S13).

When the restoring the internal state is complete, since the processing tile 11 enters the operational state, the power control unit 12 monitors the state until the wait state signal of the processing tile 11 indicates a wait state (step S14).

When the wait state is detected, the power control unit 12 asserts the state save signal (Backup), and writes the content of the internal state register in the processing logic 41 of the core memory 22 to the memory cell 32 corresponding to the content of the internal state register (step S15).

Upon finishing saving the internal state (step S15), the power control unit 12 asserts (changes from "1" to "0") the sleep control signal (SLP_I#), turns the power gating switch 23 off, and cuts off the power supply to the core logic 22 (step S16).

If the processing assigned to the processing tile 11 is not finished, the power control unit 12 monitors the wait status signal and waits until the wait status signal enters an active state (step S11). If the processing assigned to the processing tile is finished, the power control unit 12 finishes the separate power control for each of the processing tiles 500 (step S17).

2. Embodiment 2

In embodiment 1, as shown in FIG. 7B, when assigning a user circuit to a programmable device, all of the processing tiles need not necessarily be used, and depending on how the user circuits are assigned, a portion of the processing tiles may become the unused area 209.

Although supplying power to the processing tiles in the unused area 209 is not necessary, in the structure of the processing system in embodiment 1, power supply to the configuration memory cannot be cut off.

Also, although the configuration memory is configurable as a low-leak transistor, there are cases in which, when the capacity is large, the amount of leaked power as a whole cannot be ignored.

In view of this, in embodiment 2, the programmable device is configured so that the power supply to the configuration memory can also be cut off, thereby further improving energy conservation.

The following description focuses on the differences from embodiment 1.

2.1 Structure

Figure 8:
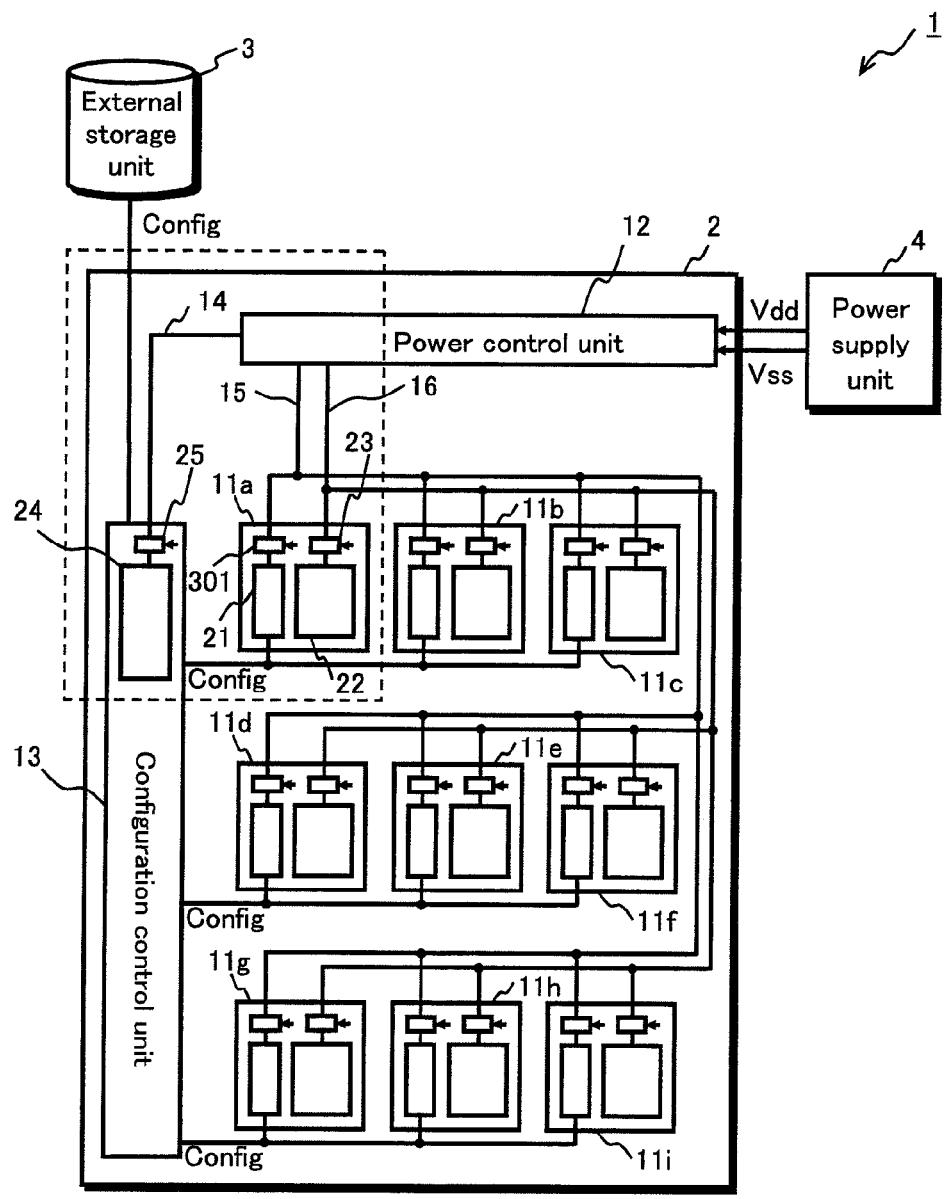
FIG. 8 is a block diagram of a programmable device pertaining to embodiment 2.

FIG. 8 shows a processing system pertaining to embodiment 2.

The processing system pertaining to embodiment 2 is different from the processing system of embodiment 1 in providing a power gating switch 301 between the configuration memory 21 and the power control unit 12.

Figure 9:
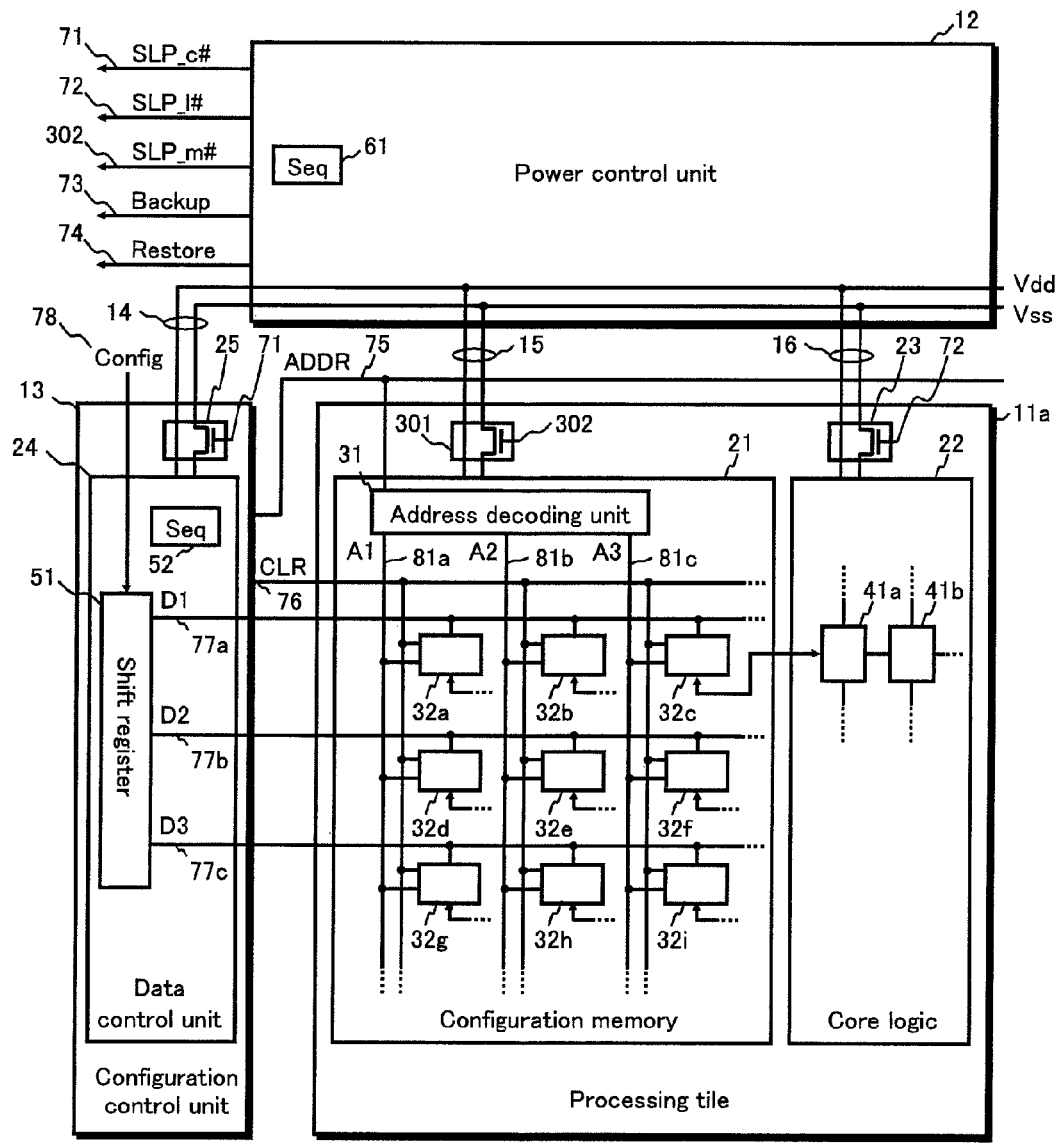
FIG. 9 is a block diagram that illustrates details of the programmable device pertaining to embodiment 2.

The portion enclosed by a dotted line in FIG. 8 is shown in greater detail in FIG. 9.

As shown in FIG. 9, a power gating switch 301 is inserted in the power supply line 15 that connects the configuration memory 21 and the power control unit 12.

The power sequencer 61 in the power control unit 12 generates the signals described in embodiment 1, and also generates the sleep control signals (the respective signals SLP_m#) 302 that Control the power gating switch 301, provides the generated signals to the power gating switch 301, and controls turning the power supply to the configuration memory on and off.

Here, as described above with reference to FIG. 7B, when assigning a user circuit to the programmable device, since the assignment results in the unused area 209 to which a function is not assigned, in the present embodiment, the configuration information pertaining to the memory cell in the processing tile pertaining to the unused area 209, is configured to include an assignment flag indicating whether there is a function assignment.

When the assignment flag in the configuration information pertaining to the memory cell included in the processing tile indicates that a function is not assigned, the power control unit 12 supplies SLP_m#, indicating that the power supply is off for that processing tile, to the power gating switch 301.

Although the power gating switches 301 are provided for each of the processing tiles, the power gating switches 301 may instead be provided for each of the memory cells, or for each of other units. For example, a power gating switch 301 may be provided for every three memory cells.

2.2 Operation

Figure 10:
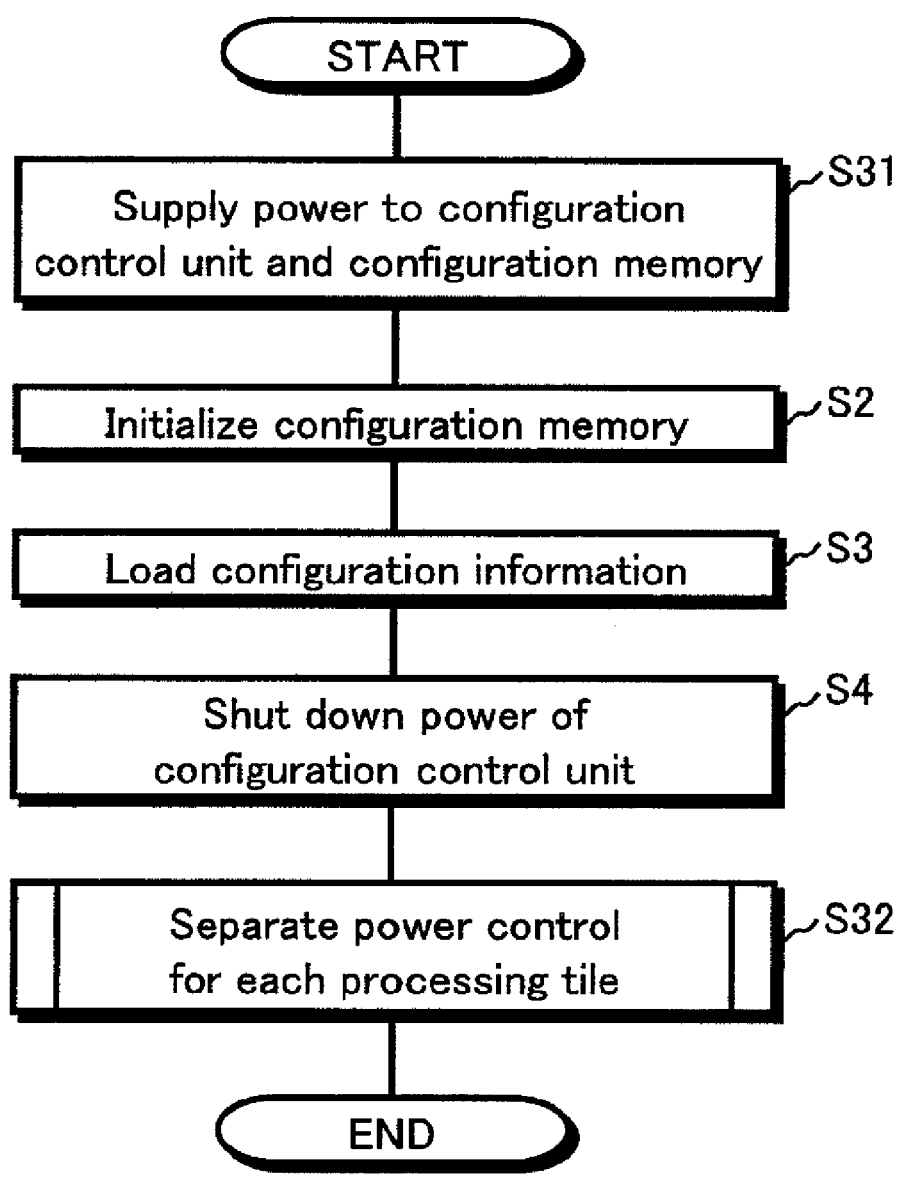
FIG. 10 is an overall control flowchart of control of the programmable device pertaining to embodiment 2.

FIG. 10 is a flowchart showing overall control of the programmable device pertaining to the present embodiment.

In FIG. 10, steps S31 and S32 are different from FIG. 5 pertaining to embodiment 1, and the other steps are the same.

In step S31, in the programmable device 2 pertaining to embodiment 2, since the default for the configuration memory 12 in the processing tile 11a is also a power cut off state, immediately after starting up, power is supplied to the configuration control memory 13 and also to the configuration memory 21 (step S31).

Figure 11:
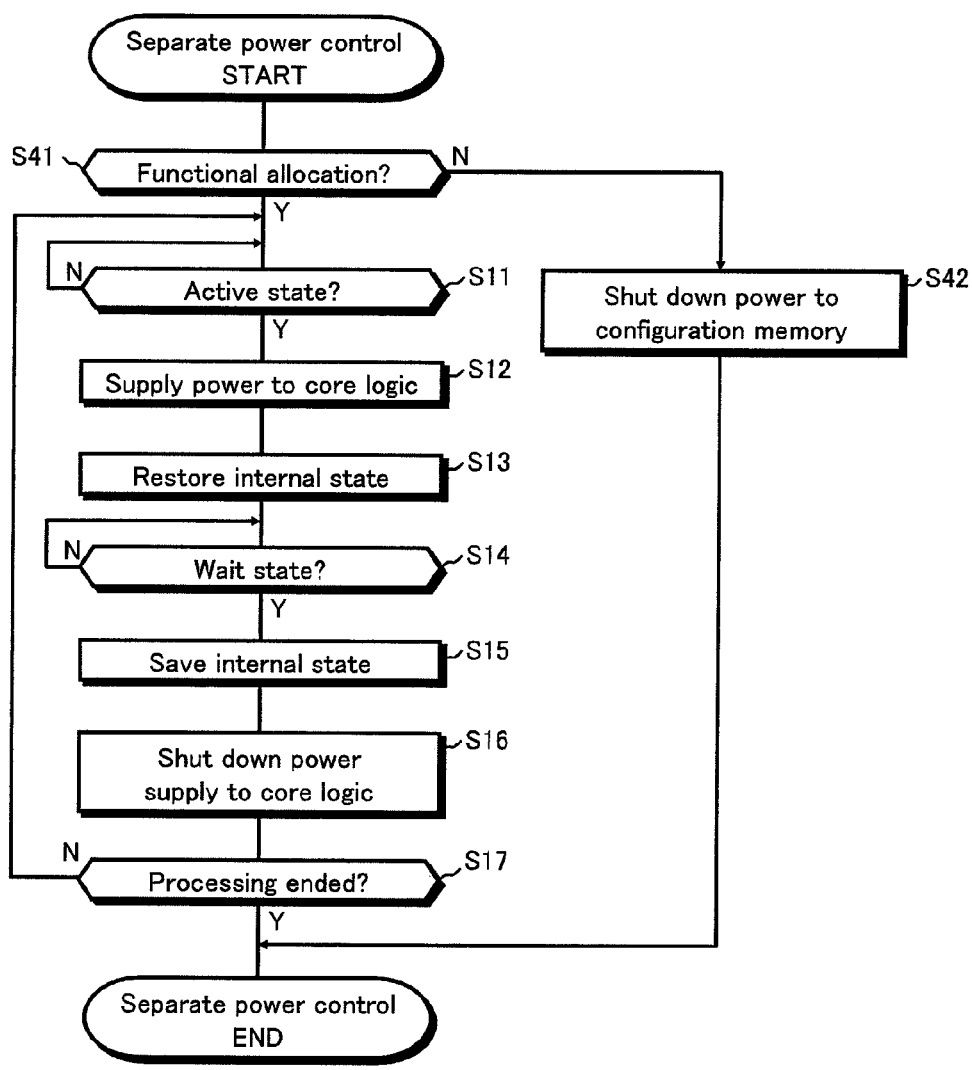
FIG. 11 is a flowchart showing separate power, control for the processing tiles pertaining to embodiment 2.

Step S32 is shown in more detail in FIG. 11.

FIG. 11 corresponds to FIG. 6 in embodiment 1, and differs from FIG. 6 with respect to steps S41 and S42.

In step S41, the power control unit 12 determines an assignment flag that indicates whether there is a function assignment, and judges whether a function has been assigned to the processing tile 11a that is targeted for control (S41). If there is a function assigned (step S41:Y), the operations already described in steps S11 to S17 are performed.

When there is not a function assigned (step S41:N), the power control unit 12 asserts (changes from "1" to "0") the sleep control signal (SLP_m#), switches the power gating switch 301 to the off state, cuts off the power supply to the configuration memory 12 (step S42), and ends the separate power control.

As described above, the power is cut off not only to the core logic 22 that is in the wait state, but also to the processing tile 11a to which a function is not assigned, and thus a further energy conservation effect is achieved compared to embodiment 1.

3. Embodiment 3

In embodiment 2, function assignment is performed on the user circuit as shown in FIG. 7(b), and the user circuit is caused to operate so that only one module at a time is in the active state, as shown in FIG. 7(c). In this case, most of the device is in an inactive state, and the use efficiency of circuit resources is low.

The programmable device pertaining to embodiment 3 is a dynamic reconfigurable device that is reconfigurable during operation.

Figure 12:
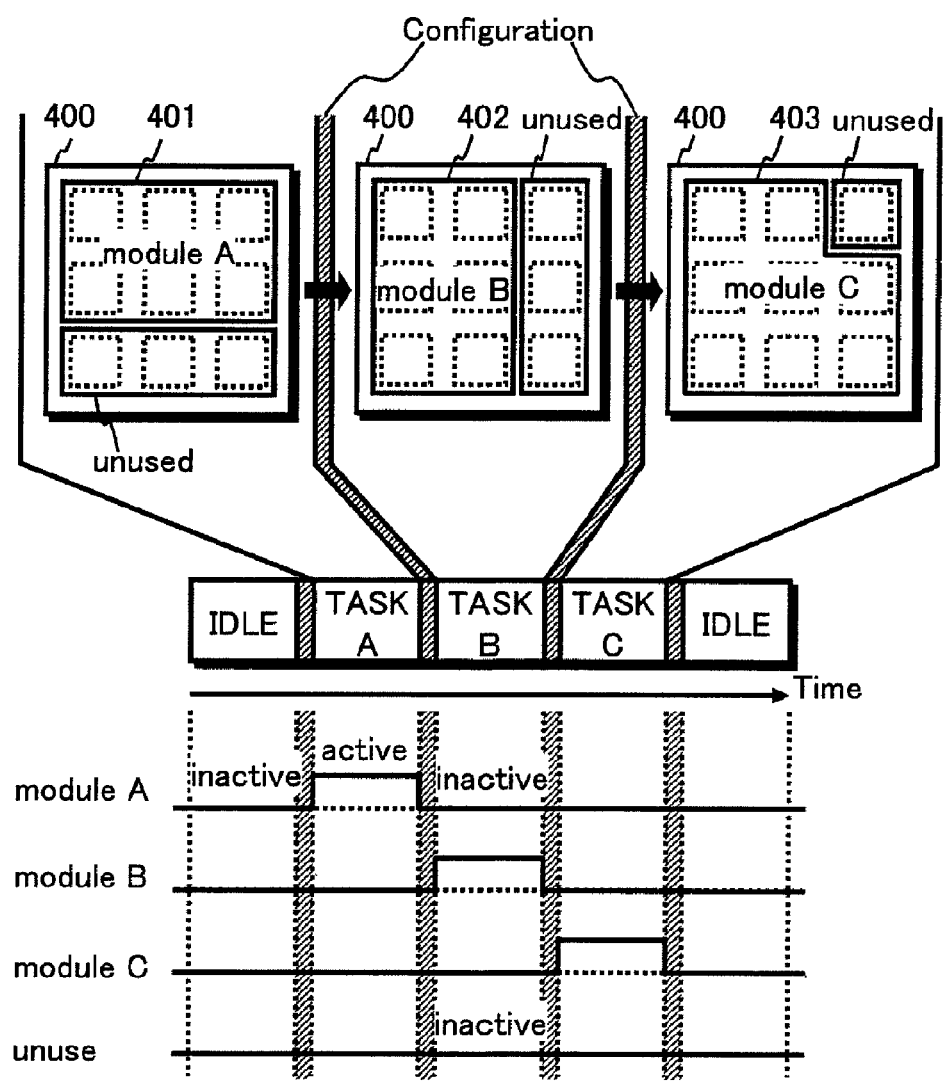
FIG. 12 shows an exemplary assignment of functions to modules in a dynamic reconfigured device pertaining to embodiment 3, and wait state signals thereof.

Specifically, as shown in FIG. 12, in one device 400, processing is advanced while a module A (401), a module B (402), and a module C (403) are dynamically assigned according to a timetable.

Here, when changing the configuration from module A (401) to module B (402), even when an internal state of the processing tile belonging to module A (401) is caused to be saved in a corresponding memory cell (the memory cell that stores therein the configuration information for initializing the processing tile) as in the above-described embodiments, since the configuration information of the next module B (402) is written over previously written information in the memory cell, when the state machine makes a full rotation and changes the configuration back to module A (401), previous processing results are lost and cannot be recovered.

Also, when performing this type of data saving with use of an external memory unit, time required for changing the configuration increases and the benefit of dynamic reconfiguration cannot be achieved.

The programmable device pertaining to embodiment 3 is configured so that saving the internal state is possible even when changing the configuration as described above.

3.1 Structure

Figure 13:
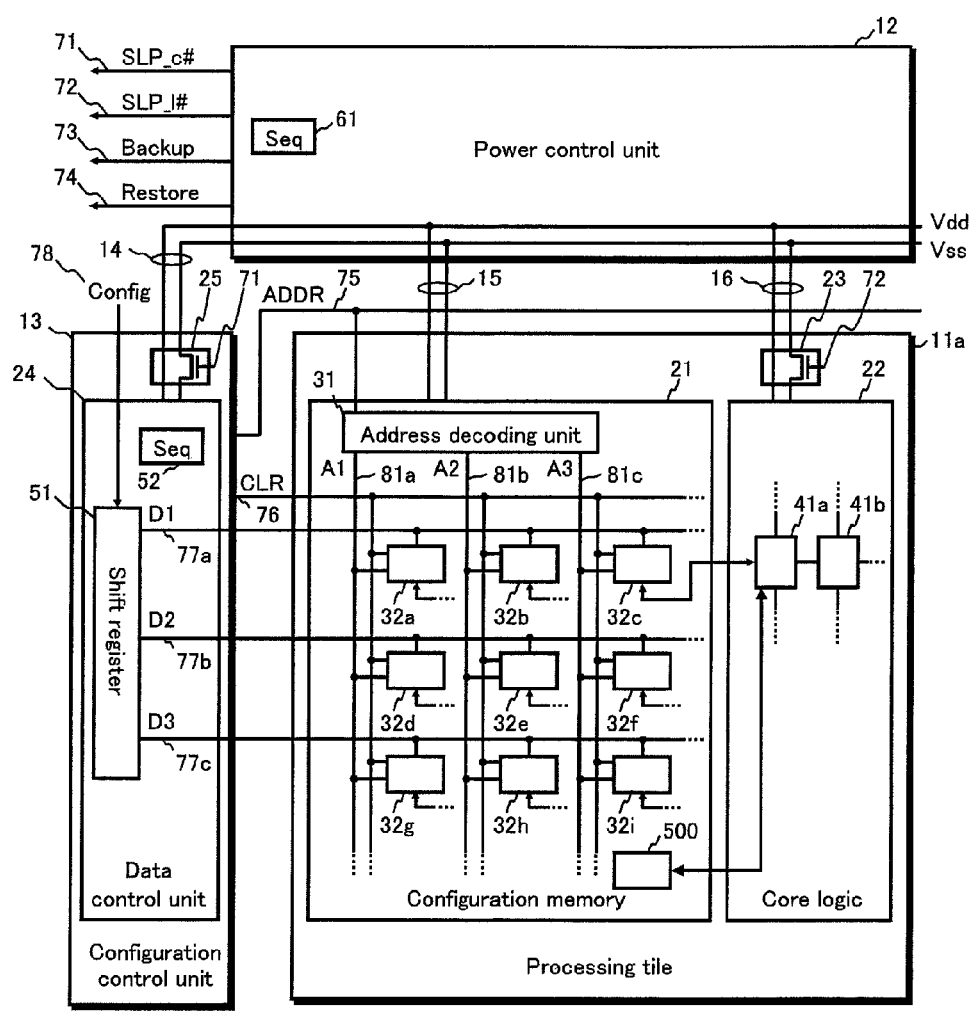
FIG. 13 shows a structure of a processing unit pertaining to embodiment 3.

The processing tile 11a pertaining to embodiment 3 shown in FIG. 13 differs in comparison with the processing tile 11a of embodiment 1 shown in FIG. 9 in providing an expanded storage area 500 in the configuration memory 21.

Internal states of the processing logics 41a, etc. of the core logic 22 are saved in the expanded memory area 500.

3.2 Operation

The overall control flowchart of the programmable device in FIG. 3 is shown in the already-described FIG. 6.

The separate control flowchart for each processing tile in the power control unit is shown in FIG. 7.

However, in FIG. 7, the detailed operation of the internal state restore step S13 and the internal state saving step S15 are different from embodiment 1.

In the internal state restore step S13 of the present embodiment, the internal state of the processing logic 41a of the core logic 22, etc. is initialized to the value of the configuration information stored in the memory cell 32 corresponding to the value when the restoring was first performed immediately after startup.

Also, in the internal state saving step S15 in the present embodiment, the value is restored from the expanded storage area 500.

In this way, in the present embodiment, by saving/restoring the internal state of the processing logic 41 with use of the expanded storage memory 500, not only at the time of cutting off the power to the core logic 22, but also at the time of changing the configuration, the internal state can be stored locally in the processing tile 11, thus enabling making more high-speed recovery from the power cut off and restoring the internal state at the time of changing the configuration.

4. Variations

Note that although the present invention has been described based on the above-described embodiments, the present invention is not limited to these embodiments, and of course, various changes may be made as long as the changes do not diverge from the essential feature of the present invention.

(1) Although the processing tiles have been described as including the configuration memory 21, the core logic 22, and the power gating switch 23 as shown in FIG. 2, this structure is only an example and does not limit the invention.

Also, although the processing logic has been described as including one each of a logic block 101 and an interconnect 102 as shown in FIG. 3, this structure is only an example and does not limit the invention.

The number of constituent elements and the connections between the constituent elements may be changed, and the constituent elements may be changed to other structures.

For example, the number of logic blocks, the number of interconnects, and the connections therebetween may be changed, and the logic blocks may be configured without using a LUT.

Figure 14:
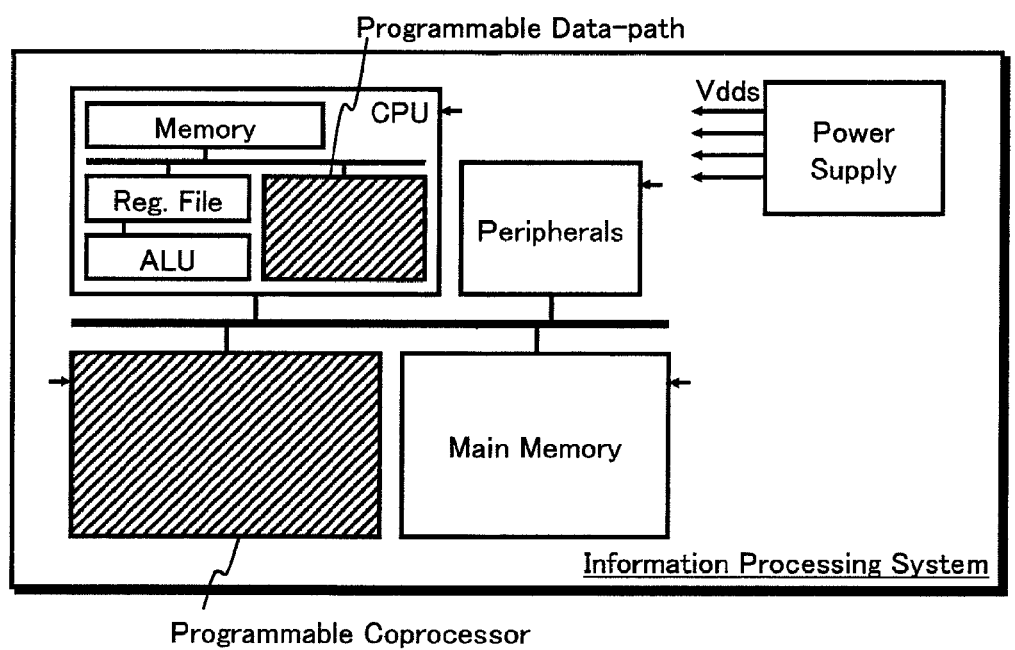
FIG. 14 shows an exemplary block diagram of an information processing system in which the programmable device pertaining to the present invention is installed.

(2) In an information processing system as shown in FIG. 14 equipped with a CPU, a main memory, peripherals, and a power supply device or the like that supplies power thereto, the programmable device of the present invention can be installed in a form such as a register file in the CPU, a programmable data path in the CPU that performs data processing in the memory, or a programmable coprocessor, located outside the CPU, that offloads the calculation processing.

(3) The above-described device is a computer system specifically structured from a microprocessor, a ROM, a RAM, a hard disk unit, a display unit, a keyboard, a mouse, etc. A computer program is stored in the RAM or the hard disk unit. The devices achieve their functions as the microprocessor operates in accordance with the computer program. Instruction code which indicates commands to the computer is structured as a combination of multiple instruction codes in order for the computer program to achieve predetermined functions.

Here, the devices are not limited to being a computer system that includes all of the elements of a microprocessor, a ROM, a RAM, a hard disk unit, a display unit, a keyboard, a mouse, etc., and may instead be a computer system structured from a portion of these.

(4) A portion or all of the constituent elements of the devices of the above embodiments and variations may be structured as a single system LSI (Large Scale Integration). A system LSI is a super multifunctional LSI manufactured by integrating a plurality of structural units onto a single chip. Specifically, it is a computer system including a microprocessor, a ROM, a RAM, and the like. A computer program is stored in the RAM. The system LSI achieves its functions as the microprocessor operates in accordance with the computer program.

Also, here, although referred to as a system LSI, an integrated circuit generated as described above may also be referred to as an IC, a system LSI, a super LSI, or an ultra LSI, depending on the degree of integration.

Also, the method of integration is not limited to being LSI integration, but instead may be realized by a dedicated circuit or a general-purpose process. After LSI manufacture, the use of an FPGA (Field Programmable Gate Array) or a silicon flexible processor in which the connection and settings of circuit cells in the LSI can be restructured is possible.

Furthermore, if integration technology is developed that replaces LSIs due to progressive or derivative semiconductor technology, integration of functional blocks using this technology is naturally possible. For example, the application of biotechnology is a possibility.

(5) A portion or all of the constituent elements of the devices of the above embodiments and variations may be structured as a removable IC card or stand-alone module. The IC card or the module is a computer system including a microprocessor, a ROM, and a RAM. The IC card and the module may include the above super multifunctional LSI. The IC card and the module achieve their functions as the microprocessor operates in accordance with the computer program. This IC card or module may be tamper resistant.

(6) The present invention may be the methods shown above. Also, the present invention may be computer programs for causing computers to realize the methods, or may be digital signals representing the computer programs.

Also, the present invention may be a computer-readable recording medium such as a flexible disk, a hard disk, a CD-ROM, an MO, a DVD, a DVD-ROM, a DVD-RAM, a BD (Blu-ray Disc), or a semiconductor memory on which the computer programs or the digital signals are recorded. The present invention may be the computer programs or the digital signals which are recorded on these recording media.

Also, the present invention may be the computer programs or digital signals which are transmitted via an electronic communications circuit, a wireless or fixed-line communications circuit, a network such as the Internet, a data broadcast, etc.

Also, the present invention may be carried out by another independent computer system by transferring the programs or the digital signals which have been recorded on the recording media, or by transferring the programs or the digital signals via the network, etc.

(7) The present invention may be any combination of the above embodiments and variations.

The programmable device of the present invention is installed in an information processing apparatus, etc. requiring energy conservation and high-speed startup from a power cut off state, and is to be manufactured, transferred, etc. by a manufacturer of the information processing apparatus.

The invention claimed is:

1. A programmable device, comprising:
a plurality of processing tiles each including a core logic unit that performs a calculation indicated by circuit information, and a configuration memory that stores the circuit information to be set in the core logic unit;
a power supply unit operable to supply power to the core logic unit and the configuration memory in each of the plurality of processing tiles; and
a control unit operable to, for each of the plurality of processing tiles, (i) when a processing tile is to be in a wait state, with use of the configuration memory included in the processing tile, save data related to an internal state of the core logic unit in the processing tile, and cut off a power supply route to the core logic unit that is separate from a power supply route to the configuration memory, and (ii) when the processing tile is to be in a used state, after connecting the power supply route to the core logic unit, restore the data related to the internal state to the core logic unit,
wherein the control unit, when cutting off the power supply route to the core logic unit, does not cut off the power supply route to the configuration memory.

2. The programmable device of claim 1, wherein
the control unit, when operation of a processing tile which has been assigned a function is temporarily stopped, cuts off the power supply route to the core logic unit included in the processing tile, and does not cut off the power supply route to the configuration memory included in the processing tile.

3. The programmable device of claim 1, wherein
the control unit, when a processing tile is not assigned a function, cuts off the power supply route to the configuration memory and the core logic unit, respectively, in the processing tile.

4. The programmable device of claim 3, wherein
the control unit, when a processing tile is assigned a function, sets the circuit information in the core logic unit.

5. A device control method for controlling a programmable device including a plurality of processing tiles each including a core logic unit that performs a calculation indicated by circuit information, and a configuration memory that stores the circuit information to be set in the core logic unit, the device control method comprising:
supplying power to the core logic unit and the configuration memory in each of the plurality of processing tiles; and
performing control so that, for each of the plurality of processing tiles, (i) when a processing tile is to be in a wait state, with use of the configuration memory included in the processing tile, save data related to an internal state of the core logic unit in the processing tile, and cut off a power supply route to the core logic unit that is separate from a power supply route to the configuration memory, and (ii) when the processing tile is to be in a used state, after connecting the power supply route to the core logic unit, restore the data related to the internal state to the core logic unit,
wherein when cutting off the power supply route to the core logic unit, the performed control does not cut off the power supply route to the configuration memory.

6. An information processing system, comprising:
a programmable device;
an external storage unit operable to store circuit information to be delivered to the programmable device; and
an external power supply unit operable to drive the programmable device, wherein the programmable device includes a plurality of processing tiles each including a core logic unit that performs a calculation indicated by circuit information, and a configuration memory that stores the circuit information to be set in the core logic unit;
a power supply unit operable to supply power, that is supplied from the external power supply unit, to the core logic unit and the configuration memory in each of the plurality of processing tiles; and
a control unit operable to, for each of the plurality of processing tiles, (i) when a processing tile is to be in a wait state, with use of the configuration memory included in the processing tile, save data related to an internal state of the core logic unit in the processing tile, and cut off a power supply route to the core logic unit that is separate from a power supply route to the configuration memory, and (ii) when the processing tile is to be in a used state, after connecting the power supply route to the core logic unit, restore the data related to the internal state to the core logic unit.

* * * * *